United States Patent
Hsu et al.

(10) Patent No.: US 9,564,577 B1
(45) Date of Patent: Feb. 7, 2017

(54) MRAM DEVICE AND FABRICATION METHOD

(71) Applicant: Taiwan Semiconductor Manufacturing Company, Ltd., Hsin-Chu (TW)

(72) Inventors: Chern-Yow Hsu, Chu-Bei (TW); Shih-Chang Liu, Alian Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/942,502

(22) Filed: Nov. 16, 2015

(51) Int. Cl.
*H01L 43/02* (2006.01)
*H01L 43/08* (2006.01)
*H01L 43/12* (2006.01)
*H01L 27/22* (2006.01)

(52) U.S. Cl.
CPC ............. *H01L 43/02* (2013.01); *H01L 27/222* (2013.01); *H01L 43/08* (2013.01); *H01L 43/12* (2013.01)

(58) Field of Classification Search
CPC .......... H01L 43/02; H01L 43/12; H01L 43/08
See application file for complete search history.

(56) References Cited

U.S. PATENT DOCUMENTS

| 8,339,841 | B2 * | 12/2012 | Iwayama | B82Y 25/00 257/295 |
| 8,962,349 | B1 | 2/2015 | Chen et al. | |
| 2015/0069556 | A1 * | 3/2015 | Yamakawa | H01L 43/02 257/421 |
| 2016/0072047 | A1 * | 3/2016 | Seto | H01L 43/08 257/421 |
| 2016/0072050 | A1 * | 3/2016 | Yoshikawa | H01L 43/08 257/421 |
| 2016/0104834 | A1 * | 4/2016 | Toko | H01L 43/12 257/421 |

OTHER PUBLICATIONS

Tehrani, S., et. al., "Magnetoresistive Random Access Memory Using Magnetic Tunnel Junctions," Proceedings of the IEEE, vol. 91, No. 5, May 2003, pp. 703-714.

* cited by examiner

*Primary Examiner* — William Coleman
(74) *Attorney, Agent, or Firm* — Slater Matsil, LLP

(57) ABSTRACT

A magnetoresistive random access memory (MRAM) device comprises a bottom electrode over a tapered bottom via, a tapered magnetic tunnel junction (MTJ) over the bottom electrode, a top electrode over the MTJ, and a top via over the top electrode. The top via, top electrode, MTJ, bottom electrode, and bottom via (and electrical interfaces therebetween) are substantially aligned along a common vertical axis. The bottom via has a taper angle of about 120° to about 150°. The MTJ has a taper angle of about 70° to about 85°. The MTJ is isolated and protected with dual sidewall spacers.

20 Claims, 9 Drawing Sheets

MRAM DEVICE AND FABRICATION METHOD

BACKGROUND

Semiconductor memories are used in a variety of applications, including various consumer electronics and commercial goods. One such semiconductor memory technology employs spin electronics. In these devices, the spin states of electrons are manipulated to store digital information. When exposed to an externally applied magnetic field, an electron's magnetic moment will align either parallel or antiparallel to the external field. For example, an electron in a parallel spin state (i.e., +½ or "spin up") may represent a binary value of 1, while an antiparallel spin state (i.e., −½ or "spin down") may represent a value of 0.

One such electronic spin device is a magnetoresistive random access memory (MRAM), which includes conductive lines (e.g., word lines and bit lines) positioned in different directions (e.g., orthogonal to each other in different device layers). The conductive lines electrically interface with a magnetic tunnel junction (MTJ) serving as a magnetic memory bit cell.

BRIEF DESCRIPTION OF THE DRAWINGS

For a more complete understanding of the disclosed embodiments and the advantages thereof, reference is made to the following description taken in conjunction with the accompanying drawings, in which.

Corresponding numerals and symbols in the different figures generally refer to corresponding elements, unless otherwise indicated. The figures are drawn to representatively illustrate relevant aspects of disclosed embodiments and are not necessarily drawn to scale.

DETAILED DESCRIPTION

The making and using of the disclosed embodiments are discussed in detail below. It should be appreciated, however, that the present specification provides many applicable inventive concepts that may be embodied in a wide variety of specific contexts. The specific embodiments discussed are merely representative of specific ways to make and use the disclosed subject matter, and do not limit the scope of the different embodiments.

Embodiments will be described with respect to a specific context; namely, magnetoresistive random access memory (MRAM) devices. Other embodiments may be alternatively, conjunctively, or sequentially applied to other semiconductor devices, structures, methods, or processes.

Figure 1:
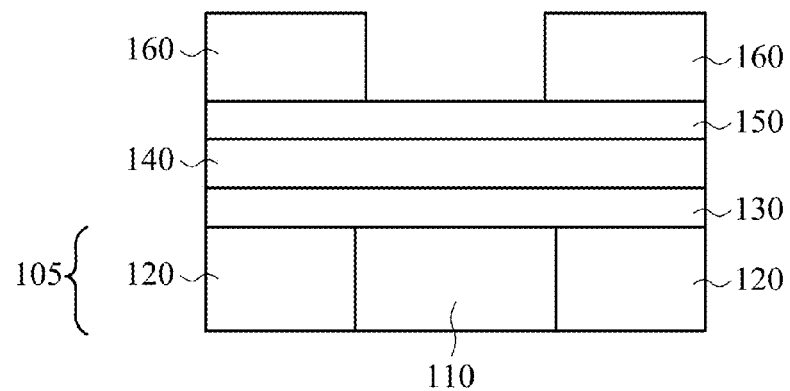
FIGS. 1 through 10 illustrate cross-sectional views of a method to form an MRAM device in accordance with a representative embodiment.

FIGS. 1 through 10 illustrate an embodiment of a representative method to form an MRAM device. FIG. 1 shows a cross-section of an MRAM structure during an initial stage of fabrication. Substrate 105 includes inter-metal dielectric (IMD) layer 120 having a metallization pattern 110 therein. IMD layer 120 may comprise an extra low-k dielectric (ELK) layer, such as an oxide (e.g., SiO, $SiO_2$), carbon-doped $SiO_2$, and/or the like, or a combination thereof. Metallization pattern 110 may comprise a conductive metal, such as, e.g., Cu, Al, and/or the like, or a combination thereof. Metallization pattern 110 provides a point of electrical contact for the subsequently formed MRAM bit cell.

Substrate 105 may be attached to active or passive devices, e.g., underlying IMD layer 120. Although underlying components are omitted from the figures for clarity of illustration, how such components may be formed and used will be readily apparent to persons skilled in the art.

FIG. 1 shows first dielectric layer 130 formed over substrate 105 and second dielectric layer 140 formed over first dielectric layer 130. Other embodiments may have only one dielectric layer. Still other embodiments may comprise more than two dielectric layers. In the illustrated example, first dielectric layer 130 may comprise SiC. In other embodiments, first dielectric layer 130 may comprise, e.g., SiN, SiOC, SiON, $SiO_2$, and/or the like, or a combination thereof. Second dielectric layer 140 may comprise SiN, $SiO_2$, and/or the like, or a combination thereof. First dielectric layer 130 and second dielectric layer 140 may have the same or different compositions. First dielectric layer 130 and second dielectric layer 140 may be formed by any suitable deposition technique, such as, e.g., chemical vapor deposition (CVD), atomic layer deposition (ALD), physical vapor deposition (PVD), and/or the like, or a combination thereof.

Antireflective coating (ARC) layer 150 overlies second dielectric layer 140, and photoresist material 160 overlies ARC 150. Specular reflections, thin-film interference, and/or standing waves may inhibit sharp feature definition during imaging of photoresist material 160. Antireflective coating (ARC) layer 150 improves photo resolution by reducing optical distortions associated with, e.g., reflection of stray light from the surface of substrate 105.

In a representative embodiment, ARC layer 150 may comprise a nitrogen-free ARC to further improve feature definition during development of photoresist material 160. Nitrogen at the photoresist/ARC interface can neutralize acid during development of photoresist material 160, resulting in residue formation and footing. A nitrogen-free ARC may be used to prevent or otherwise reduce footing. If a nitrogen-free ARC is not used, imprecisely formed features or excessive residue after lithographic patterning may result. Both of these can detrimentally affect subsequent processing. To prevent or otherwise reduce footing, ARC layer 150 may comprise a nitrogen-free organic material (e.g., $C_xH_xO_x$) or dielectric material (e.g., SiC, SiON, $SiO_2$) and may be formed over second dielectric layer 140 using CVD, ALD, PVD, and/or the like, or a combination thereof.

Figure 2:
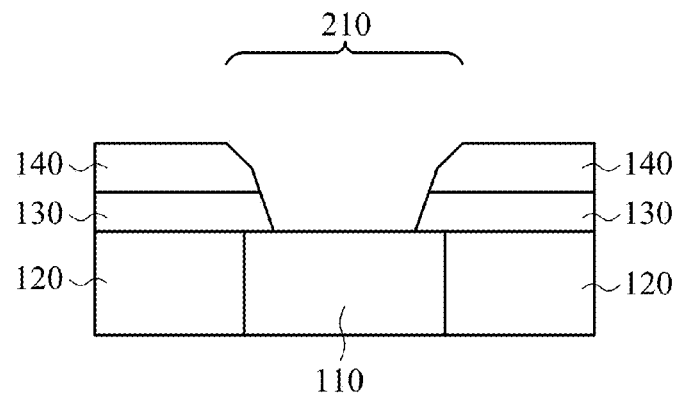

As representatively illustrated in FIG. 2, opening 210 is formed through first dielectric layer 130 and second dielectric layer 140 to expose a portion of metallization pattern 110. Opening 210 may be defined with dielectric plasma etching employing fluorocarbon chemistry. When plasma containing fluorocarbon gases are ignited, the gases are partially decomposed by electron impact dissociation. Kinetic rates for deposition, suppression, and chemical sputtering processes can be modified by adjusting the ratio of fluorocarbon gases used; e.g., $CF_4$, $CHF_3$, $CH_2F_2$, and $CH_3F$. In a representative embodiment, $N_2$ may be used as a carrier gas and a $CF_4$:$CHF_3$:$CH_2F_2$:$CH_3F$ ratio may be tuned to produce tapered sidewall profiles of opening 210. The ratio between different fluorocarbon species may be controlled by the reactor design and process conditions (e.g., pressure, power, flow rate, etc.). Alternatively, conjunctively, or sequentially, opening 210 may be formed using any suitable etching technique, whether now known or hereafter derived in the art, capable of producing a tapered sidewall profile in opening 210. In a representative embodiment, opening 210 has a tapered sidewall profile with an interiorly disposed taper angle of about 120° to about 150°, as measured with respect to the major surface of substrate 105.

During or after dielectric plasma etching, $SiO_2$ may be deposited for sidewall profile corner feature rounding with argon RF glow discharge sputtering. $SiO_2$ deposition may be controlled by modification of various sputtering process parameters: e.g., Ar pressure, RF power, electrode spacing, substrate temperature, magnetic field strength, etc.

Figure 3:
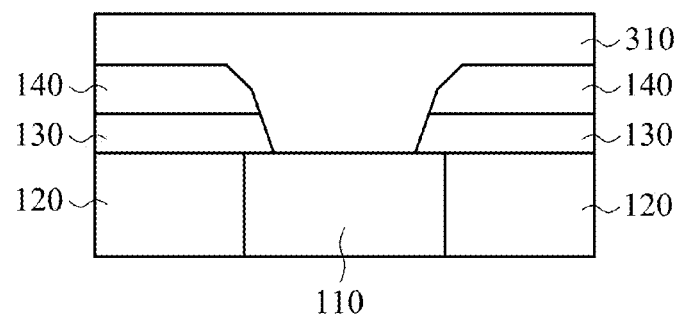
Figure 4:
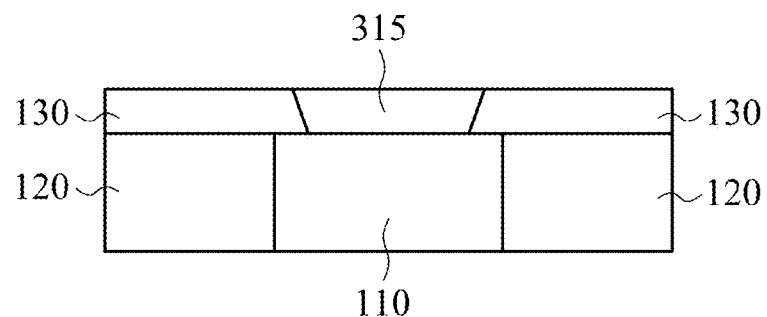

FIGS. 3 and 4 illustrate the deposition and removal of conductive material 310 for subsequent formation of bottom via 315. Conductive material 310 (and subsequently formed bottom via 315) may comprise, e.g., Ta, W, TaN, Ti, TiN, Cu, Al, and/or the like, or combinations thereof. In a representative embodiment, conductive material 310 and subsequently formed bottom via 315 comprise at least one of Ta, Ti, TaN, or TiN. Conductive material 310 may be deposited in opening 210 with CVD, ALD, or PVD, and/or the like, or combinations thereof. The interiorly disposed taper angle (e.g., between about 120° and about) 150° allows for suitable conformal deposition of conductive material 310 in opening 210 that is substantially void-free and uniformly distributed.

As representatively illustrated in FIG. 4, after deposition of conductive material 310 in opening 210 and over at least a portion of second dielectric layer 140, a chemical mechanical planarization (CMP) may be performed to remove conductive material 310 and second dielectric layer 140 to form a top surface of bottom via 315 and to expose a top surface of first dielectric layer 130. Any suitable removal process, whether now known or hereafter derived, may be alternatively, conjunctively, or sequentially employed to form bottom via 315 and/or expose top surface of first dielectric layer 130.

Figure 5:
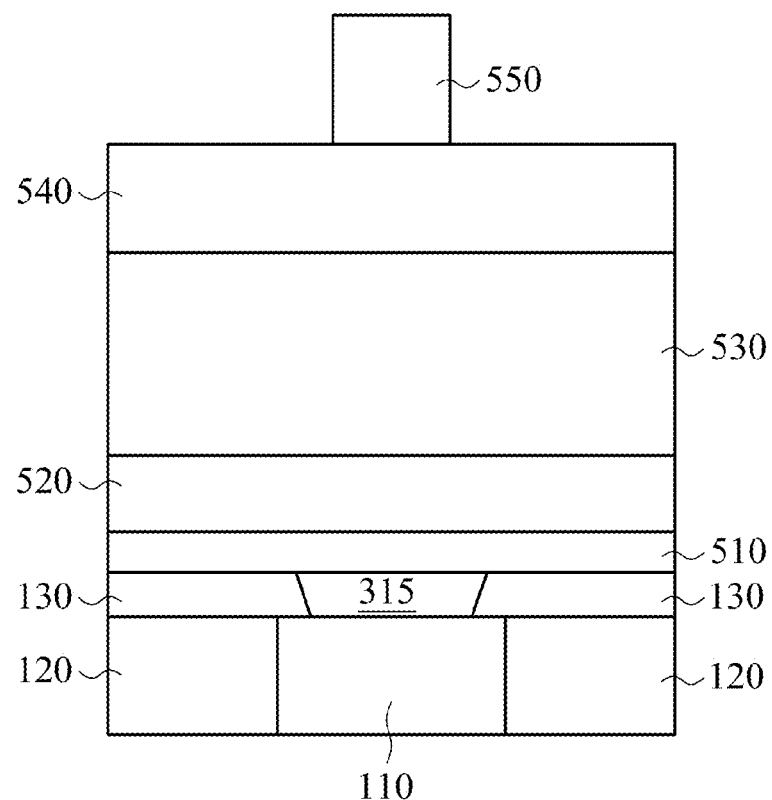

FIG. 5 representatively illustrates the deposition of bottom electrode layer 510, magnetic tunnel junction (MTJ) layer(s) 520, top electrode layer 530, hard mask layer 540, and photoresist 550. Bottom electrode layer 510 is formed over first dielectric layer 130 and bottom via 315. Thereafter, MTJ layer(s) 520 are formed over bottom electrode layer 510. Next, top electrode layer 530 is formed over MTJ layer(s) 520, followed by hard mask layer 540 and photoresist 550. As representatively depicted in FIG. 5, photoresist 550 is shown after having been exposed and developed according to a layout pattern, as is known in the art. Each of the bottom electrode layer 510, top electrode layer 530, and hard mask layer 540 may be formed using any suitable deposition technique, such as, e.g., CVD, ALD, PVD, and/or the like, or a combination thereof. Each of the bottom electrode layer 510 and top electrode layer 530 may comprise W, TiN, TaN, Ti, Ta, Cu, Al, and/or the like, or a combination thereof. A representative thickness of bottom electrode layer 510 may range from about 10 nm to about 100 nm. A representative thickness of top electrode layer 530 may range from about 10 nm to about 100 nm. Hard mask layer 540 may comprise SiC, SiN, SiOC, SiON, $SiO_2$, and/or the like, or combinations thereof.

MTJ layer(s) 520 may comprise various component layers formed of different materials. In a representative embodiment, MTJ layer(s) 520 may include a pinning layer, a tunnel barrier layer, and a free layer. Additionally, MTJ layer(s) 520 may include other layers, such as antiferromagnetic layers. In a representative embodiment, a pinning layer may be formed of PtMn, a tunnel barrier layer may be formed of MgO, and a free layer may be formed of CoFeB. Any of MTJ layer(s) 520 may alternatively or conjunctively comprise Co, Fe, B, Ru, Ni, Cr, MgO, $Al_2O_3$, and/or the like, or combinations thereof. The magnetic moment of the free layer may be programmed, causing the resistance of the resulting MTJ cell to be switchable between a high resistance and a low resistance for storing a bit of digital data. A representative thickness of MTJ layer(s) 520 ranges from about 10 nm to about 40 nm. It will be understood by persons skilled in the art that MTJ layer(s) 520 may comprise many variations, all of which are within the scope of the present disclosure.

Figure 6:
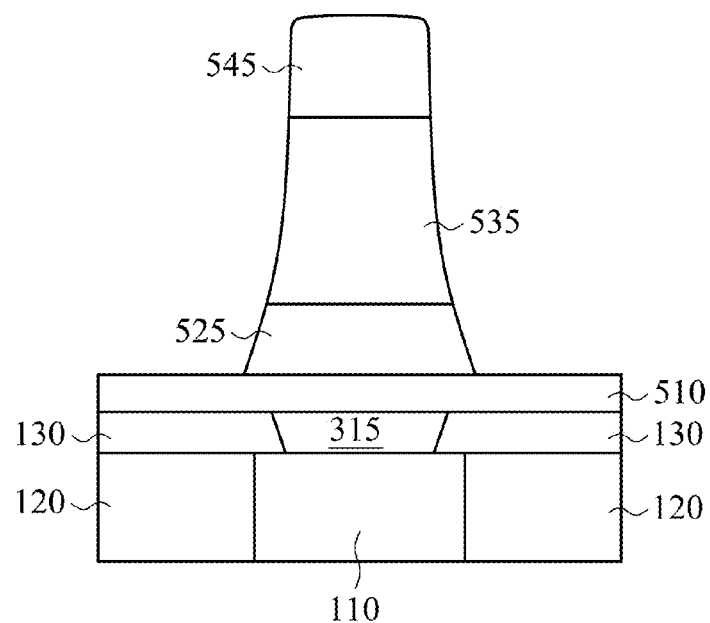

As representatively illustrated in FIG. 6, various layers shown in FIG. 5 (540, 530, 520) are etched to form MTJ 525, top electrode 535, and hard mask cap 545. Hard mask layer 540, top electrode layer 530, and MTJ layer(s) 520 may be etched using any suitable etching technique, whether now known or hereafter derived.

In a representative embodiment, an etching process may begin with fluorocarbon plasma etching of hard mask layer 540. As described previously, kinetic rates for deposition, suppression, and chemical sputtering can be modified by adjusting the ratio of fluorocarbon gases used. $N_2$ may be used as a carrier gas and the $CF_4$:$CHF_3$:$CH_2F_2$:$CH_3F$ ratio may be tuned to achieve desired etching selectivity, as is known in the art.

A metal etching process is thereafter engaged to etch top electrode layer 530. In a representative embodiment, top electrode layer 530 is etched with a $BCl_3$/$Cl_2$ chemistry in plasma (or other metal etchant from the CRC Handbook of Metal Etchants, CRC Press, 1$^{st}$ Ed., 1990, ISBN-13: 978-0849336232) using $N_2$ and Ar as carrier gases. Etching selectivity (e.g., to impart a tapered sidewall profile to top electrode 535) may be tuned by adjusting the $BCl_3$:$Cl_2$ ratio in conjunction with various plasma etching parameters (e.g., pressure, power, flow rate, etc.), as is known in the art.

Another metal etching process is subsequently engaged to etch MTJ layer(s) 520. In a representative embodiment, MTJ layer(s) 520 are etched with a $BCl_3$/$Cl_2$/$NH_3$/CO or other chemistry in plasma (or other metal etchant from the CRC Handbook of Metal Etchants) using $N_2$, Ar, and $H_2$ as carrier gases. $H_2$ may be used to increase carrier gas compressibility. Etching selectivity (e.g., to ensure that etching stops on bottom electrode layer 510 and that a tapered sidewall profile is imparted to MTJ 525) may be tuned by adjusting the ratio of $BCl_3$:$Cl_2$:$NH_3$:CO in combination with various plasma etching parameters (e.g., pressure, power, flow rate, etc.), as is known in the art.

In a representative embodiment, MTJ 525 has a tapered sidewall profile with an interiorly disposed taper angle of between about 70° and about 85°, as measured with respect to the major surface of bottom electrode layer 510. In accordance with other representative aspects, top electrode 535 and hard mask cap 545 may also have tapered sidewall profiles.

As MTJ layer(s) 520 are etched to expose underlying bottom electrode layer 510, material forming bottom electrode layer 510 experiences bombardment from the plasma etching process. Consequently, bottom electrode material will be liberated from the surface of bottom electrode layer 510. Under such circumstances, the liberated bottom electrode material may redeposit on MTJ 525. An MTJ 525 tapered sidewall profile corresponding to an interiorly disposed taper angle of between about 70° and about 85° was found to acceptably reduce redeposit of bottom electrode material on MTJ 525.

Figure 7:
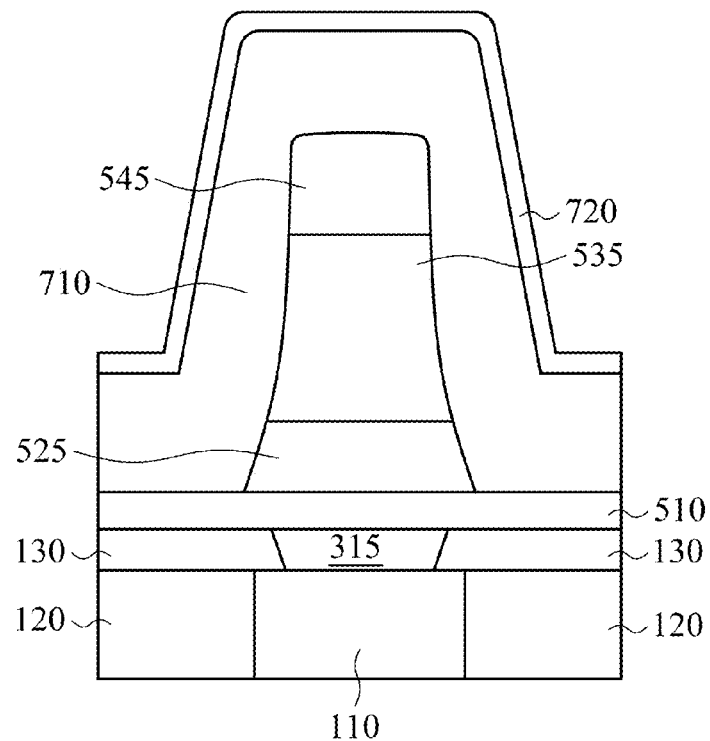

FIG. 7 illustrates conformal deposition of first dielectric spacer material 710 and second dielectric spacer material 720 over and around MTJ 525, top electrode 535, and hard mask cap 545. First dielectric spacer material 710 overlies and is in physical contact with at least a portion of bottom electrode layer 510. Second dielectric spacer material 720 overlies bottom electrode layer 510 and is laterally adjacent to at least a portion of first dielectric spacer material 710.

Any suitable deposition technique for depositing first dielectric spacer material 710 and second dielectric spacer material 720 may be used, such as, e.g., CVD, PVD, ALD, and/or the like, or a combination thereof. In a representative embodiment, each of first dielectric spacer material 710 and second dielectric spacer material 720 may comprise SiC, SiN, SiOC, $SiO_2$, and/or the like, or combinations thereof. In a representative embodiment, first dielectric spacer material 710 comprises SiN deposited with a thickness of about 15 nm to about 50 nm, and second dielectric spacer material 720 comprises $SiO_2$ deposited with a thickness of about 5 nm to about 20 nm.

Inasmuch as MTJ 525, top electrode 535, and hard mask cap 545 have tapered sidewall profiles, conformal deposition of first dielectric spacer material 710 over and around MTJ 525, top electrode 535, and hard mask cap 545 will impart a corresponding tapered profile to first dielectric spacer material 710. Conformal deposition of second dielectric spacer material 720 over and around first dielectric spacer material 710 will impart a corresponding tapered profile to second dielectric spacer material 720. Tapered profiles of first dielectric spacer material 710 and second dielectric spacer material 720 are generally shown in FIG. 7.

Figure 8:
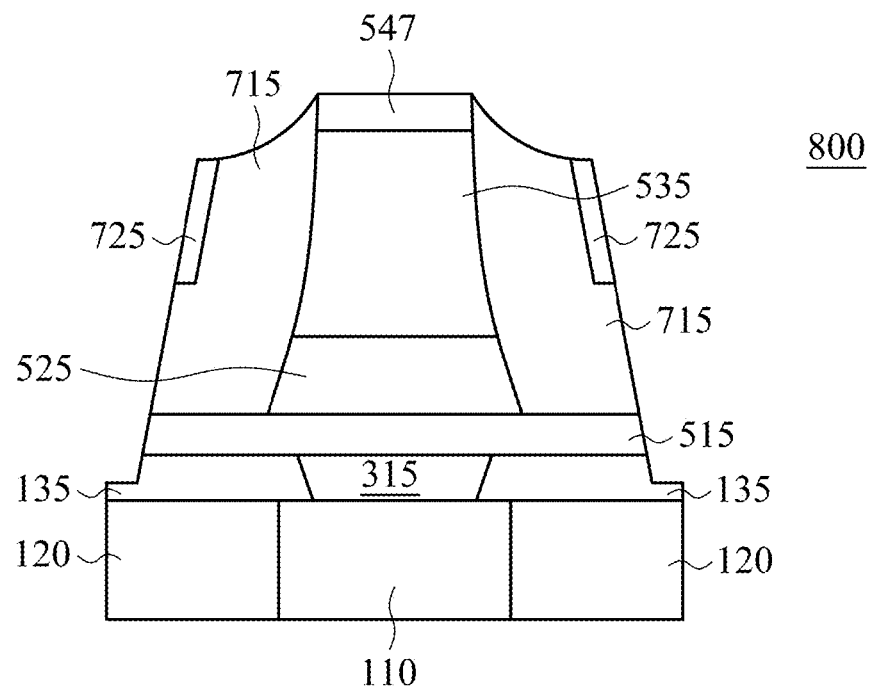

FIG. 8 illustrates the formation of various MRAM device 800 features after etch-back.

Second dielectric material 720, first dielectric material 710, and hard mask cap 545 are etched in a dielectric etch process with a $CF_4/CHF_3/CH_2F_2/CH_3F$ chemistry in plasma using $N_2$ and Ar as carrier gases. Etching selectivity may be tuned by adjusting the $CF_4:CHF_3:CH_2F_2:CH_3F$ ratio in combination with various plasma etching parameters (e.g., pressure, power, flow rate, etc.), as is known in the art. Second dielectric material 720 is etched to form second spacer 725. First dielectric material 710 is etched to form first spacer 715. Hard mask cap 545 is etched to form thinned cap 547. First spacer 715 and second spacer 725 serve to isolate and protect MTJ 525. The composition of second spacer 725 ($SiO_2$ in the representatively disclosed embodiment) may additionally serve to preserve the vertical height of first spacer 715. That is to say that the $CF_4:CHF_3:CH_2F_2:CH_3F$ ratio may be tuned, in combination with other plasma etching parameters, to promote etching of the first dielectric material 710 (SiN in the representatively disclosed embodiment) and inhibit etching of the second dielectric material 720 in order to produce first spacer 715 with a desired vertical height.

Bottom electrode layer 510 and first dielectric layer 130 are etched with a $BCl_3/Cl_2$ chemistry in plasma (or other metal etchant from the CRC Handbook of Metal Etchants) using $N_2$ and Ar as carrier gases. Etching selectivity may be tuned by adjusting the $BCl_3:Cl_2$ ratio in combination with various plasma etching parameters (e.g., pressure, power, flow rate, etc.), as is known in the art. First dielectric layer 130 is etched to form profiled stop layer 135. Bottom electrode layer 510 is etched to form bottom electrode 515. In accordance with representative embodiments, bottom electrode 515 can be patterned with the dry etching processes herein described without the requirement of an additional photomask. Accordingly, bottom electrode 515 may be generally regarded as being self-aligned. Etching of bottom electrode 515 produces discrete MRAM cells by removing portions of the bottom electrode layer 510 that would otherwise form electrical connections between adjacent MRAM cells within an array.

Figure 9:
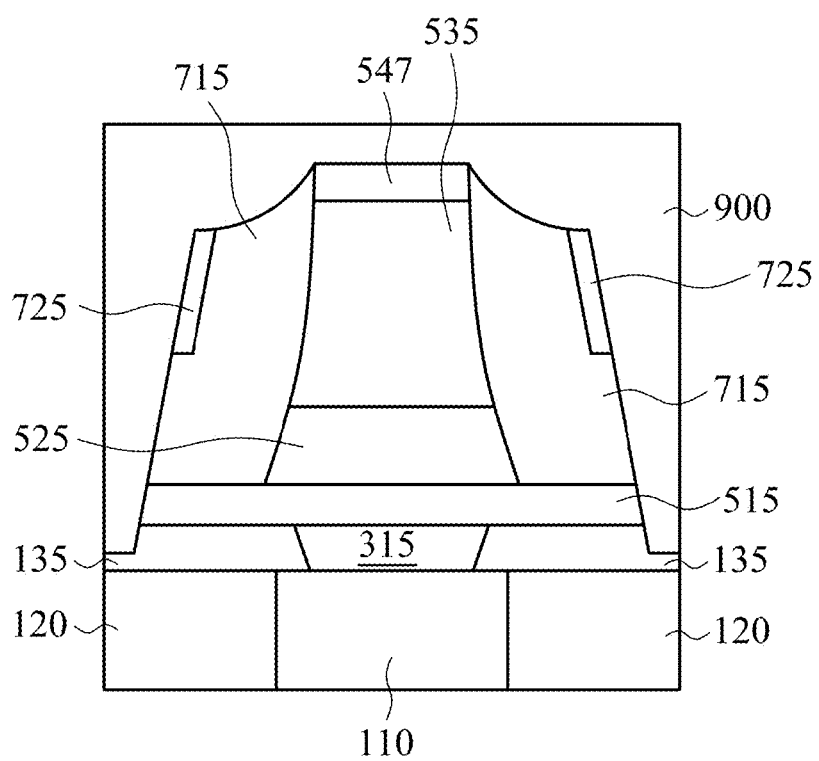

FIG. 9 representatively illustrates deposition of dielectric material to form isolation layer 900 over and around thinned cap 547, first spacer 715, second spacer 725, the sidewalls of tapered bottom electrode 515, and the exposed portions of profiled stop layer 135. In a representative embodiment, isolation layer 900 comprises an IMD material that electrically isolates MRAM device elements from adjacent MRAM cells within an array. Isolation layer 900 may comprise, for example, a low-K dielectric material, an ELK material, and/or the like, or a combination thereof. Any suitable technique for depositing isolation layer 900 may be used, such as, e.g., CVD, PVD, ALD, and/or the like, or a combination thereof. As representatively illustrated in FIG. 10, after deposition, isolation layer 900 may be planarized (e.g., CMP) to expose a top surface of thinned cap 547.

Figure 10:
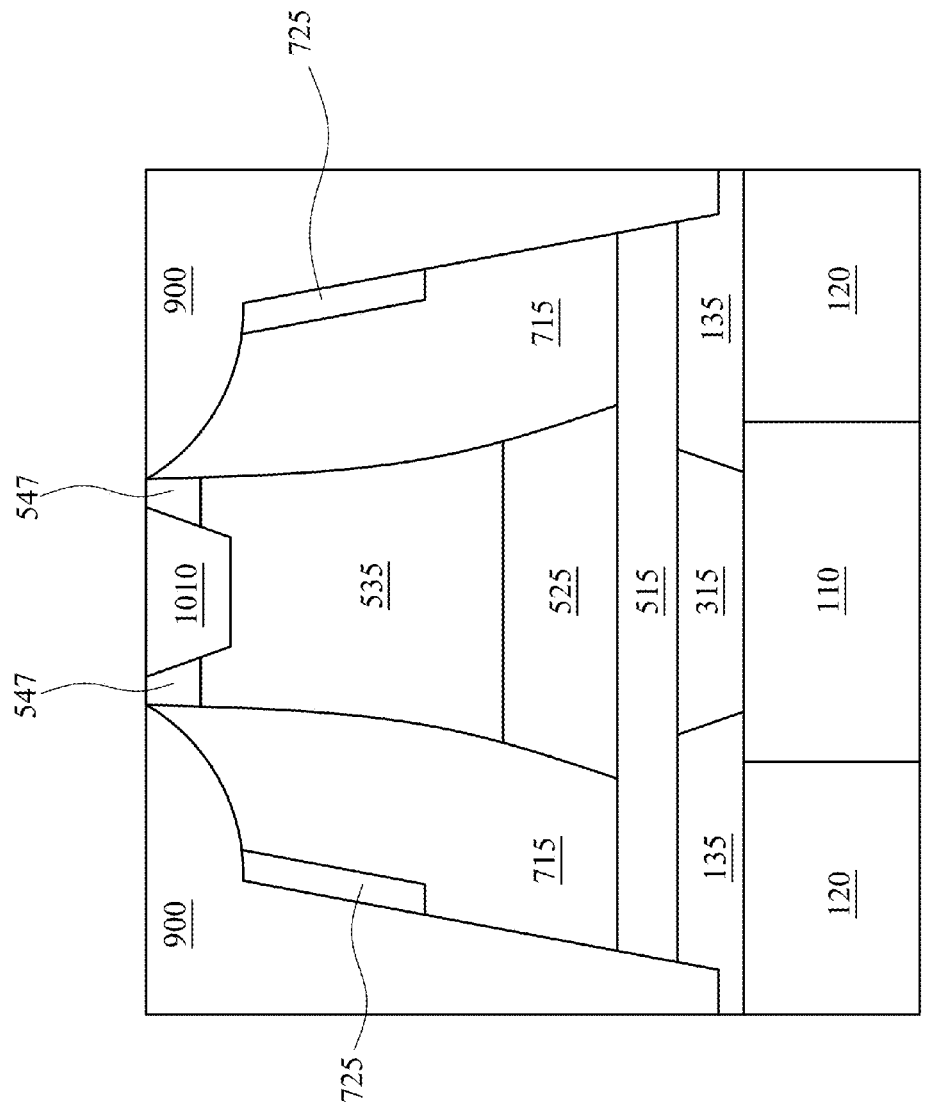

FIG. 10 also depicts introduction of top via 1010 through thinned cap 547 to provide an electrical interface with top electrode 535. Any method for providing via 1010, whether now known or hereafter derived in the art, may be used. In a representative embodiment, a punch process may be used to introduce via 1010. Via formation is well known in the art and, as such, further description is omitted herein for brevity.

Figure 11A:
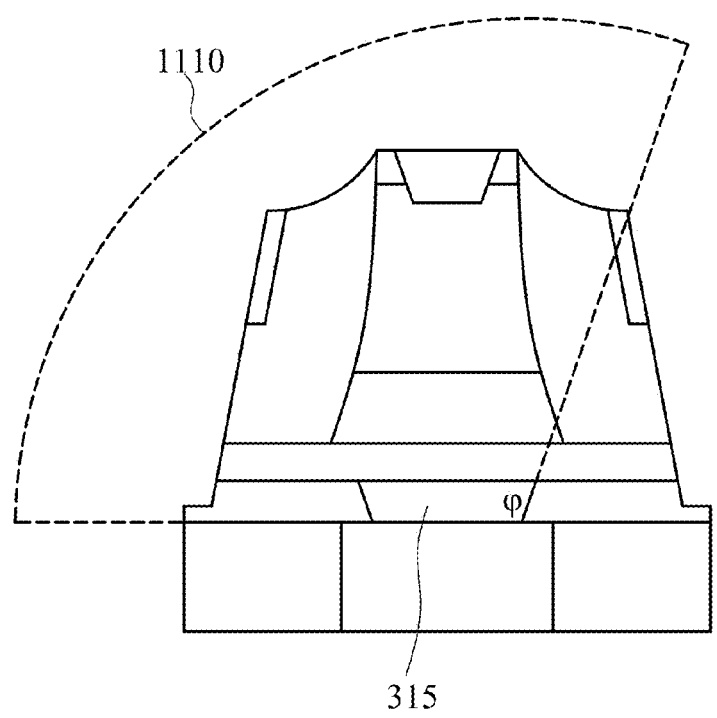
FIGS. 11a and 11b illustrate cross-sectional views of interiorly disposed sidewall taper angles for MRAM device elements in accordance with a representative embodiment.
Figure 11B:
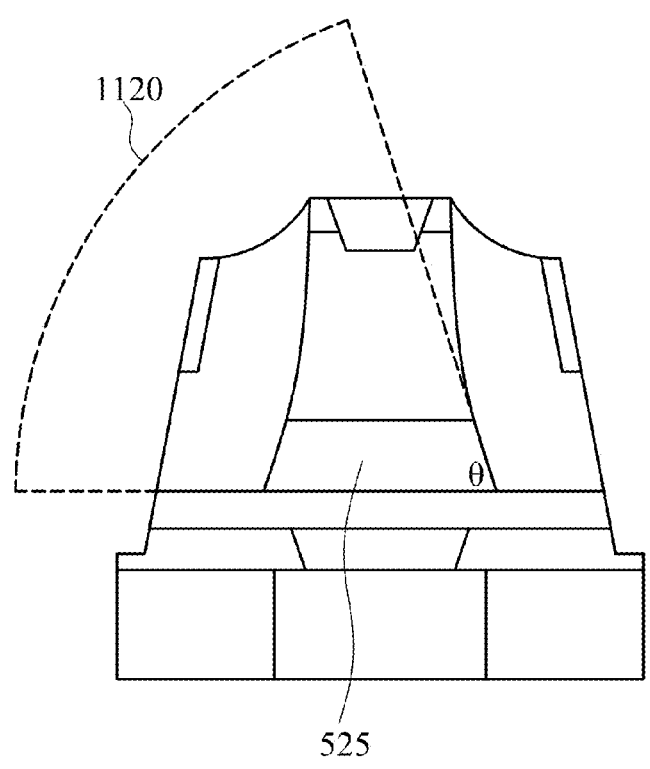

FIGS. 11a and 11b representatively illustrate sidewall profile features for bottom via 315 and MTJ 525. Bottom via 315 may have a sidewall profile feature with an interiorly disposed taper angle φ (about 120° to about 150°) corresponding to arc 1110 (about 2 rad to about 2.6 rad). MTJ 525 may have a sidewall profile feature with an interiorly disposed taper angle θ (about 70° to about 85°) corresponding to arc 1120 (about 1.2 rad to about 1.5 rad).

Figure 12A:
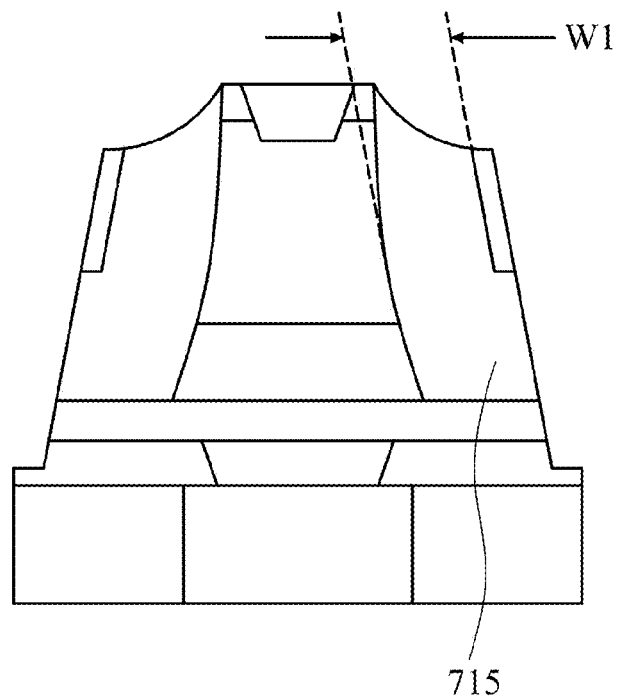
FIGS. 12a and 12b illustrate cross-sectional views of MRAM spacer element features in accordance with a representative embodiment.
Figure 12B:
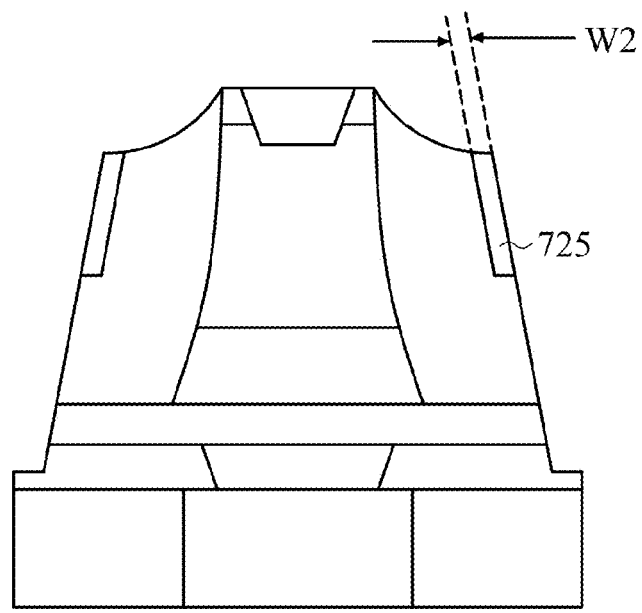

FIGS. 12a and 12b representatively illustrates width specifications for first spacer 715 and second spacer 725. First spacer 715 may have a sidewall-to-sidewall width w1 of about 15 nm to about 50 nm. Second spacer 725 may have a sidewall-to-sidewall width w2 of about 5 nm to 20 nm.

Figure 13:
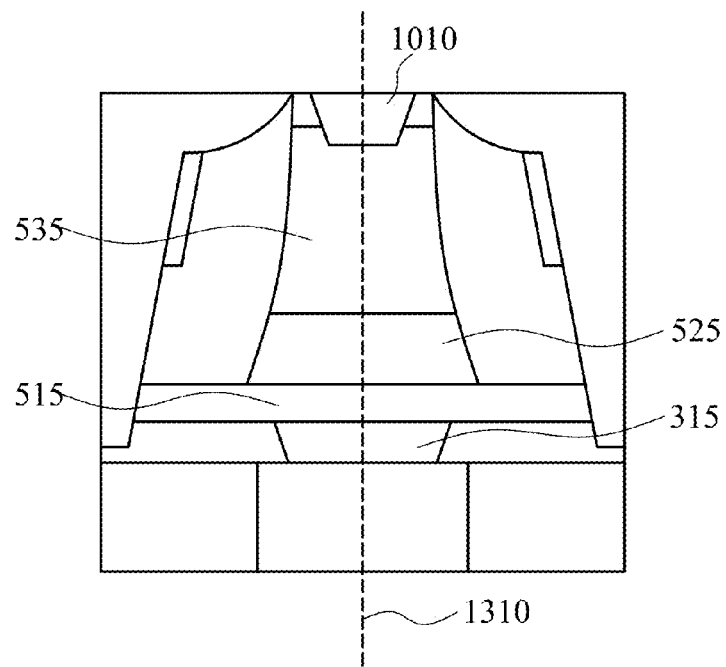
FIG. 13 illustrates a cross-sectional view of a spatial arrangement of MRAM device elements in accordance with a representative embodiment.

FIG. 13 representatively illustrates spatial arrangement of various MRAM device elements and electrical interfaces therebetween. The centers of mass of bottom via 315, bottom electrode 515, MTJ 525, top electrode 535, and top via 1010 are substantially aligned along a common, substantially vertical axis 1310. The electrical interfaces among and between bottom via 315, bottom electrode 515, MTJ 525, top electrode 535, and top via 1010 are also substantially aligned along the common, substantially vertical axis 1310. Accordingly, the centers of mass of bottom via 315, bottom electrode 515, MTJ 525, top electrode 535, and top via 1010 are substantially aligned along an axis common to the axis of substantial alignment of the electrical interfaces among and between bottom via 315, bottom electrode 515, MTJ 525, top electrode 535, and top via 1010.

Figure 14:
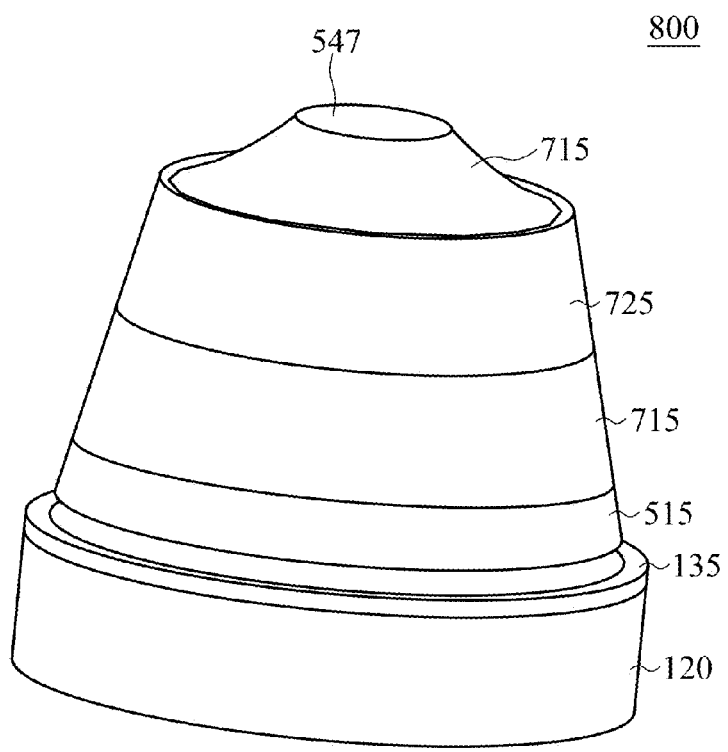
FIG. 14 illustrates a perspective view of an MRAM device in accordance with a representative embodiment.

FIG. 14 representatively illustrates a perspective view of the MRAM device 800 shown in FIG. 8.

Various benefits and advantages may be realized by representative embodiments disclosed herein. For example, a substantially self-aligned bottom electrode may have a center of mass axis and electrical interface axis substantially coincident and vertically aligned with the center of mass axes and electrical interface axes of, e.g., a substrate metallization feature, a bottom via, an MTJ, a top electrode, and a top via. The avoidance of off-axis via connection to a bottom electrode may improve device fill area, reduce the number of manufacturing defects, and decrease discrete device feature size (i.e., lateral width) of individual MRAM cells. This allows MRAM devices to be more densely packed in a given array area. Furthermore, and as representatively illustrated in FIGS. 7 and 8, etch-back feature definition of a bottom electrode may be accomplished without requiring an additional photomask, as would typically be required in the conventional art. Furthermore, dual encapsulating spacer elements may provide increased strength and improved protection of the MTJ sidewalls. Additionally, the tapered profile of the MTJ sidewalls help to avoid redeposit of decomposed etchant and/or etching by-products. Moreover, representative embodiments provide features to prevent or otherwise reduce MTJ misalignment and subsequent damage (e.g., electrical shorting) during introduction of a top via.

According to one embodiment, an MRAM device includes a bottom electrode over a conductive via, the conductive via has a first tapered sidewall. An MTJ is disposed over the bottom electrode, the MTJ has a second tapered sidewall. A top electrode is disposed over the MTJ. A first dielectric material is adjacent to the top electrode and the MTJ, and a second dielectric material is adjacent to at least a portion of the first dielectric material. The first tapered sidewall has a taper angle of about 120° to about 150°. The second tapered sidewall has a taper angle of about 70° to about 85°. A first spacer is formed from the first dielectric material. The first spacer has a width of about 15 nm to about 50 nm. A second spacer is formed from the second dielectric material. The second spacer has a width of about 5 nm to about 20 nm. The first dielectric material includes SiC, SiN, SiOC, or $SiO_2$, or a combination thereof. The second dielectric material includes SiC, SiN, SiOC, or $SiO_2$, or a combination thereof. The conductive via includes W, TiN, TaN, Ti, Ta, Cu, or Al, or a combination thereof. The bottom electrode includes W, TiN, TaN, Ti, Ta, Cu, or Al, or a combination thereof. The top includes W, TiN, TaN, Ti, Ta, Cu, or Al, or a combination thereof.

According to another embodiment, an MRAM device comprises a bottom electrode over a bottom via, an MTJ over the bottom electrode, a top electrode over the MTJ, and a top via over the top electrode. The top via, top electrode, MTJ, bottom electrode, and bottom via are aligned along a common, substantially vertical axis. A sidewall profile of the bottom via has a taper angle of about 120° to about 150°. A sidewall profile of the MTJ has a taper angle of about 70° to about 85°. The MTJ is isolated and protected by a first spacer and a second spacer. The first spacer comprises a first dielectric material that is located adjacent to the top electrode and the MTJ. The first dielectric material at least partly overlies the bottom electrode. The second spacer comprises a second dielectric material that is located adjacent to the first spacer along an exterior sidewall portion of the first spacer. The first dielectric material may or may not have the same composition as compared with the second dielectric material. The first spacer may have a width of about 15 nm to about 50 nm. The second spacer may have a width of about 5 nm to about 20 nm.

Figure 15:
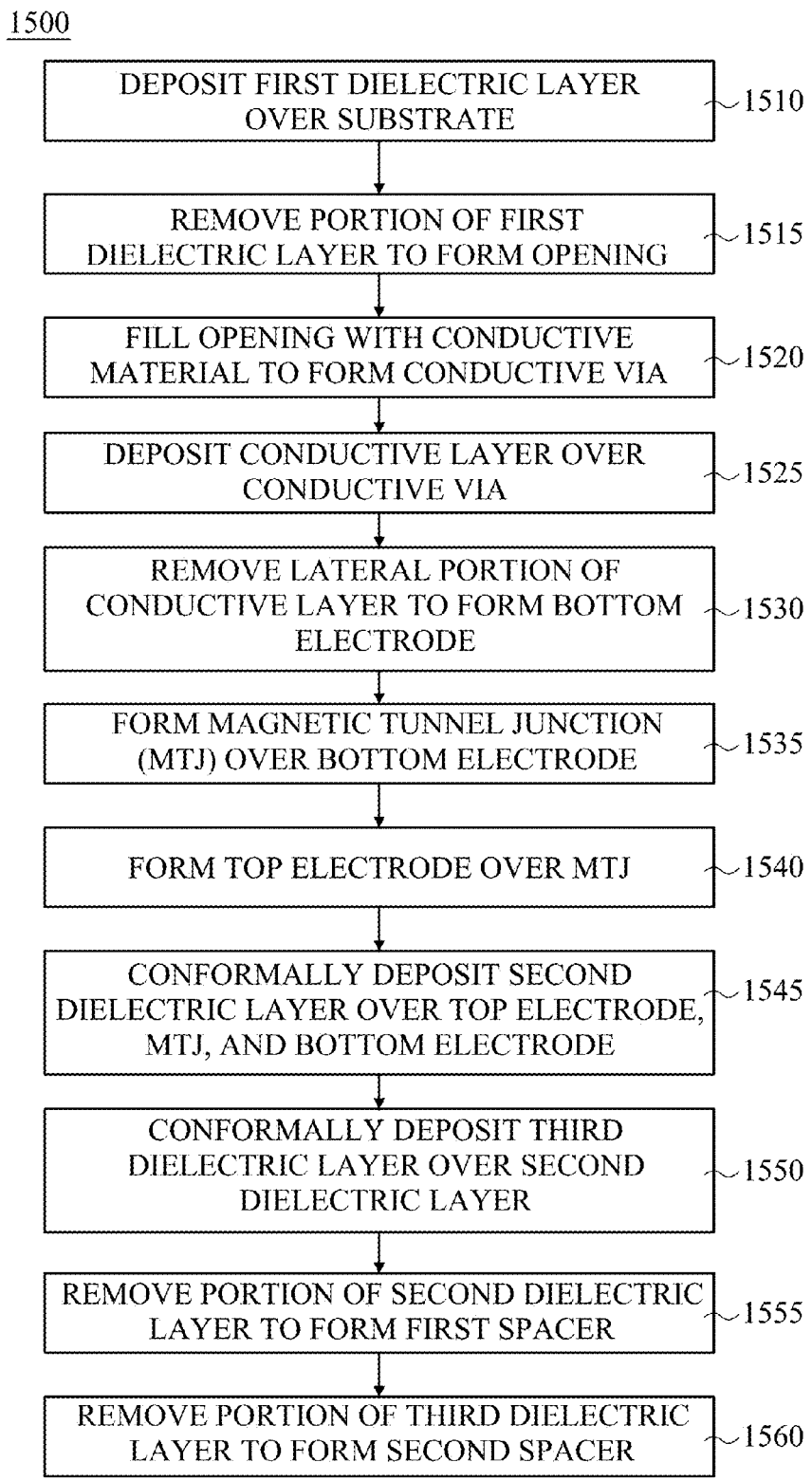
FIG. 15 is a flowchart of a method for fabricating an MRAM device in accordance with a representative embodiment.

In accordance with another embodiment as representatively illustrated in FIG. 15, a method for fabricating an MRAM device includes: depositing a first dielectric layer over a substrate (step 1510); removing a portion of the first dielectric layer to form an opening (step 1515); filling the opening with a conductive material to form a conductive via (step 1520); depositing a conductive layer over the conductive via (step 1525); removing a laterally disposed portion of the conductive layer to form a bottom electrode (step 1530); forming an MTJ over the bottom electrode (step 1535); forming a top electrode over the MTJ (step 1540); depositing a conformal second dielectric layer over the top electrode, the MTJ, and the bottom electrode (step 1545); depositing a conformal third dielectric layer over the second dielectric layer (step 1550); removing at least a portion of the second dielectric layer to form a first spacer (step 1555); and removing at least a portion of the third dielectric layer to form a second spacer (step 1560). The opening has a tapered sidewall with an interiorly disposed taper angle greater than 90° (e.g., about 120° to about 150°). Removal of the laterally disposed portion of the conductive layer forms a tapered sidewall of the bottom electrode. Removal of a laterally disposed portion of the MTJ forms a tapered sidewall of the MTJ. The tapered sidewall of the MTJ has an interiorly disposed taper angle of less than 90° (e.g., about 70° to about 85°). The first spacer has a width of about 15 nm to about 50 nm. The second spacer has a width of about 5 nm to about 20 nm.

According to another embodiment, an MRAM device may be produced by forming a bottom via over a substrate, forming a bottom electrode over the bottom via, forming an MTJ over the bottom electrode, forming a top electrode over the MTJ, and forming a top via over the top electrode. The top via, top electrode, MTJ, bottom electrode, and bottom via are aligned along a common, substantially vertical axis. The bottom via is formed to have a sidewall taper angle of about 120° to about 150°. The bottom via is formed by depositing a dielectric layer over the substrate, patterning the dielectric layer with an etch process to form a tapered opening, depositing a conductive material in the tapered opening and over at least a portion of the dielectric layer, and performing a planarization operation to remove conductive material to form a top surface of the bottom via and to expose a top surface of the dielectric layer. The bottom electrode is formed by depositing a bottom electrode layer over the bottom via and patterning the bottom electrode layer with an etch process to define sidewall features of the bottom electrode. The MTJ is patterned with an etch process to define tapered sidewall features with a taper angle of about 70° to about 85°. First and second spacers are formed to isolate and protect the MTJ. The first and second spacers are formed by depositing a first dielectric material over the top electrode, the MTJ, and the bottom electrode, and depositing a second dielectric material over the first dielectric material. The first dielectric material at least partly overlies the bottom electrode. A portion of the first dielectric material is removed to form the first spacer. The second spacer comprises a second dielectric material that is located adjacent to the first spacer along an exterior sidewall portion of the first spacer. A portion of the second dielectric material is removed to form the second spacer. The first dielectric material may or may not be the same as the second dielectric material. The first spacer is formed to have a width of about 15 nm to about 50 nm. The second spacer is formed to have a width of about 5 nm to about 20 nm.

In accordance with another embodiment, an MRAM device, includes a bottom via over a substrate, a bottom electrode over the bottom via, an MTJ over the bottom electrode, a top electrode over the MTJ, a top via over the top electrode, a first dielectric material annularly disposed around the top electrode and the MTJ (the first dielectric material at least partially overlying and in physical contact with the bottom electrode), and a second dielectric material annularly disposed around a portion of the first dielectric material. The sidewall profile of the bottom via has an interiorly disposed taper angle of about 120° to about 150°. The sidewall profile of the MTJ has an interiorly disposed taper angle of about 70° to about 85°. The first dielectric material forms a first spacer having a width of about 15 nm to about 50 nm. The second dielectric material forms a second spacer having a width of about 5 nm to about 20 nm. The top electrode, MTJ, bottom electrode, and via are substantially aligned along a common vertical axis.

In yet another embodiment, an MRAM device comprises a bottom via over a substrate, a bottom electrode over the bottom via (the bottom electrode having a first electrical interface with the bottom via), an MTJ over the bottom electrode (the MTJ having a second electrical interface with the bottom electrode), a top electrode over the MTJ (the top electrode having a third electrical interface with the MTJ), a top via over the top electrode (the top via having a fourth electrical interface with the top electrode), a first dielectric material along a sidewall of the top electrode and the MTJ, and a second dielectric material along an exterior sidewall portion of the first dielectric material. The top via, top electrode, MTJ, bottom electrode, and bottom via are aligned along a common substantially vertical first axis. The first, second, third, and fourth electrical interfaces are aligned along a common, substantially vertical second axis. The second axis is substantially coincident with the first axis. A sidewall profile of the bottom via has a taper angle of about 120° to about 150°. A sidewall profile of the MTJ has a taper angle of about 70 to about 85°. The MTJ is isolated and protected by a first spacer and a second spacer. The first spacer comprises the first dielectric material located along the sidewalls of the top electrode and the MTJ. The second spacer comprises the second dielectric material located along the exterior sidewall portion of the first dielectric material. The first dielectric material may or may not be the same as the second dielectric material. The first spacer may have a width of about 15 nm to about 50 nm. The second spacer may have a width of about 5 nm to about 20 nm.

As used herein, the terms "comprises," "comprising," "includes," "including," "has," "having," or any contextual variant thereof, are intended to cover a non-exclusive inclusion. For example, a process, article, or apparatus that comprises a list of elements is not necessarily limited to only those elements but may include other elements not expressly listed or inherent to such process, article, or apparatus. Further, unless expressly stated to the contrary, "or" refers to an inclusive or and not to an exclusive or. That is, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, a term preceded by "a" or "an" (and "the" when antecedent basis is "a" or "an") includes both singular and plural of such term, unless the context clearly indicates otherwise. Also, as used in the description herein, the meaning of "in" includes "in" and "on," unless the context clearly indicates otherwise. As used herein, the term "adjacent" is intended to mean "near," "nearby," or "not distant."

As used herein, the term "annular," or contextual variants thereof, are intended to mean "of, relating to, or forming a ring."

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification, and all such embodiments are intended to be included within the scope of that term or terms. Language designating such non-limiting examples and illustrations includes, but is not limited to: "for example," "for instance," "e.g.," "in a representative embodiment," "in one embodiment." Reference throughout this specification to "one embodiment," "an embodiment," "a representative embodiment," or "a specific embodiment," or contextually similar terminology means that a particular feature, structure, or characteristic described in connection with the embodiment is included in at least one embodiment and may not necessarily be present in all embodiments. Thus, respective appearances of the phrases "in one embodiment," "in an embodiment," or "in a specific embodiment," or similar terminology in various places throughout this specification are not necessarily referring to the same embodiment. Furthermore, the particular features, structures, or characteristics of any particular embodiment may be combined in any suitable manner with one or more other embodiments.

Although steps, operations, or procedures are presented in a specific order, this order may be changed in different embodiments. In some embodiments, to the extent multiple steps are shown as sequential in this specification, some combination of such steps in alternative embodiments may be performed at the same time or in a different order. The sequence of operations described herein may be interrupted, suspended, or otherwise controlled by another process.

Although representative embodiments and their advantages have been described in detail, it should be understood that various changes, substitutions, and alterations may be made herein without departing from the spirit and scope of the disclosure as defined by the appended claims. Moreover, the scope of the present disclosure is not intended to be limited to the particular embodiments of any process, product, machine, manufacture, assembly, apparatus, composition of matter, means, methods, or steps described in the specification. As one skilled in the art will readily appreciate from the disclosure, various processes, products, machines, manufacture, assemblies, apparatuses, compositions of matter, means, methods, or steps, whether presently existing or later developed, that perform substantially the same function or achieve substantially the same result as the corresponding representative embodiments described herein may be utilized according to the disclosure herein. Accordingly, the appended claims are intended to include within their scope such processes, products, machines, manufacture, assemblies, apparatuses, compositions of matter, means, methods, or steps.

Benefits, other advantages, and solutions to problems have been described with regard to specific embodiments; however, benefits, advantages, solutions to problems, and any component(s) that may cause any benefit, advantage, or solution to occur or become more pronounced are not to be construed as a critical, required, or essential feature or component.

What is claimed is:

1. A magnetoresistive random access memory (MRAM) device, comprising:
   a bottom electrode over a conductive via, the conductive via having a first tapered sidewall;
   a magnetic tunnel junction (MTJ) over the bottom electrode, the MTJ having a second tapered sidewall;
   a top electrode over the MTJ;
   a first dielectric material adjacent to the top electrode and the MTJ; and
   a second dielectric material adjacent to at least a portion of the first dielectric material, wherein the first dielectric material and the second dielectric material comprise different material layers, and at least a portion of a first sidewall of the first dielectric material distally disposed from the top electrode is substantially adjoined with a second sidewall of the second dielectric material distally disposed from the top electrode.

2. The device of claim 1, wherein the first tapered sidewall comprises a taper angle of about 120° to about 150°.

3. The device of claim 1, wherein the second tapered sidewall comprises a taper angle of about 70° to about 85°.

4. The device of claim 1, wherein at least one of:
   the first dielectric material comprises a first spacer having a first width between about 15 nm to about 50 nm; or
   the second dielectric material comprises a second spacer having a second width between about 5 nm to about 20 nm.

5. The device of claim 1, wherein:
   the first dielectric material comprises at least one of SiC, SiN, SiOC, or $SiO_2$; and
   the second dielectric material comprises at least one of SiC, SiN, SiOC, or $SiO_2$.

6. The device of claim 1, wherein at least one of the conductive via, the bottom electrode, or the top electrode comprises at least one of W, TiN, TaN, Ti, Ta, Cu, or Al.

7. A method of fabricating a magnetoresistive random access memory (MRAM) device, the method comprising:
   depositing a first dielectric layer over a substrate;
   removing a portion of the first dielectric layer to form an opening;
   filling the opening with a conductive material to form a conductive via;
   depositing a conductive layer over the conductive via;
   removing a laterally disposed portion of the conductive layer to form a bottom electrode;
   forming a magnetic tunnel junction (MTJ) over the bottom electrode;
   forming a top electrode over the MTJ;
   conformally depositing a second dielectric layer over the top electrode, the MTJ, and the bottom electrode;
   conformally depositing a third dielectric layer over the second dielectric layer;
   removing at least a portion of the second dielectric layer to form a first spacer; and
   removing at least a portion of the third dielectric layer to form a second spacer, wherein at least a portion of the first spacer is disposed above an upper-most surface of the second spacer.

8. The method of claim 7, wherein the opening comprises a tapered sidewall having an interiorly disposed taper angle greater than 90°.

9. The method of claim 7, wherein removing the laterally disposed portion of the conductive layer forms a tapered sidewall of the bottom electrode.

10. The method of claim 7, wherein forming the MTJ comprises removing a laterally disposed portion of the MTJ to form a tapered sidewall of the MTJ.

11. The method of claim 7, wherein:
   the first spacer has a width of about 15 nm to about 50 nm; and
   the second spacer has a width of about 5 nm to about 20 nm.

12. The method of claim 8, wherein the tapered sidewall comprises an interiorly disposed taper angle of about 120° to about 150°.

13. The method of claim 10, wherein the tapered sidewall of the MTJ comprises an interiorly disposed taper angle less than 90°.

14. The method of claim 13, wherein the tapered sidewall of the MTJ comprises an interiorly disposed taper angle of about 70° to about 85°.

15. A magnetoresistive random access memory (MRAM) device, comprising:
   a bottom via over a substrate;
   a bottom electrode over the bottom via;
   a magnetic tunnel junction (MTJ) over the bottom electrode;
   a top electrode over the MTJ;
   a top via over the top electrode;
   a first spacer comprising a first dielectric material annularly disposed around the top electrode and the MTJ, wherein the first spacer comprises a bottom surface, the first spacer overlies the bottom electrode, a first lateral extent of the bottom surface is substantially equal to a second lateral extent of the bottom electrode, and the bottom surface is in physical contact with the bottom electrode; and
   a second spacer comprising a second dielectric material annularly disposed around a portion of the first dielectric material.

16. The device of claim 15, wherein a sidewall profile of the bottom via has an interiorly disposed taper angle of about 120° to about 150°.

17. The device of claim 15, wherein a sidewall profile of the MTJ has an interiorly disposed taper angle of about 70° to about 85°.

18. The device of claim 15, wherein the first dielectric material comprises a first spacer having a width of about 15 nm to about 50 nm.

19. The device of claim 15, wherein the second dielectric material comprises a second spacer having a width of about 5 nm to about 20 nm.

20. The device of claim 15, wherein the top electrode, MTJ, bottom electrode, and via are substantially aligned along a common vertical axis.

* * * * *